United States Patent [19]
Bartha et al.

[11] Patent Number: 5,707,537
[45] Date of Patent: Jan. 13, 1998

[54] BULK REMOVAL, TRANSPORT AND STORAGE FIXTURE FOR SMALL BATCH-FABRICATED DEVICES

[75] Inventors: Johann Bartha, Metelen; Johann Greschner, Pliezhausen; Klaus Meissner, Herrenberg; Volkhard Wolf, Sindelfingen, all of Germany

[73] Assignee: International Business Machines Corporation, Armonk, N.Y.

[21] Appl. No.: 477,058

[22] Filed: Jun. 7, 1995

[30] Foreign Application Priority Data

Jan. 23, 1995 [EP] European Pat. Off. ............ 95100836

[51] Int. Cl.$^6$ ............................... H01L 21/00; H05K 7/02
[52] U.S. Cl. .................... 216/2; 216/56; 206/724; 206/725; 361/809
[58] Field of Search ............................ 216/2, 39, 56; 206/722, 724, 725

[56] References Cited

U.S. PATENT DOCUMENTS

| | | | |
|---|---|---|---|
| 4,185,814 | 1/1980 | Buchmann et al. | 271/108 |
| 4,329,642 | 5/1982 | Luthi et al. | 324/158 F |
| 5,085,321 | 2/1992 | Chew | 206/331 |
| 5,149,162 | 9/1992 | Focke et al. | 294/641 |
| 5,335,771 | 8/1994 | Murphy | 206/328 |
| 5,418,692 | 5/1995 | Nemoto | 361/809 |
| 5,520,297 | 5/1996 | Kagami et al. | 216/12 |

FOREIGN PATENT DOCUMENTS

| | | | |
|---|---|---|---|
| 62-249446 | 10/1987 | Japan | H01L 21/68 |
| 3268336 | 11/1991 | Japan | H01L 21/52 |

OTHER PUBLICATIONS

TDB, Cornerless Chip Bank, 3L, No.5, May 1993 pp. 219–220.
TDB, Reversible Tray For IC Module, 36, No. 5, May 1993, pp. 395–396.

*Primary Examiner*—R. Bruce Breneman
*Assistant Examiner*—Michael E. Adjodha
*Attorney, Agent, or Firm*—Ira D. Blecker

[57] ABSTRACT

The supporting plate and the bulk removal, transport and storage fixture for small batch-fabricated devices (1) have openings (2) penetrating from the top side (3) to the bottom side (4) of the plate and raised retaining means (5) on the bottom side (4). The raised retaining means (5) are provided in sufficient number and are arranged according to the shape of the devices (1) for retaining the devices. Flange means (7) which are designed for providing vacuum or agents to the devices (1) on the supporting plate are connected to the supporting plate thus forming a fixture. By changing the arrangement of the raised retaining means (5) and/or the openings (2) the supporting plate and the fixture may easily be adapted to different sizes and kinds of devices.

17 Claims, 4 Drawing Sheets

BULK REMOVAL, TRANSPORT AND STORAGE FIXTURE FOR SMALL BATCH-FABRICATED DEVICES

FIELD OF THE INVENTION

The present invention relates to the technical field of bulk removal, transport and storage of small batch-fabricated devices. More particularly it relates to a supporting plate for small batch-fabricated devices and a bulk removal, transport and storage fixture for these devices. It also relates to a method for producing the supporting plate and to methods using the bulk removal, transport and storage fixture for controlled bulk removal of small batch-fabricated devices and for storing and/or transporting the individual devices.

BACKGROUND OF THE INVENTION

An advantage inherent to the microfabrication of mechanical, optical, electrical or other kinds of devices is the possibility of simultaneously manufacturing a great amount of devices, the so-called batch fabrication. E.g. in microelectronic manufacturing there are several hundred chips produced on/from the same wafer and in microptic or micromechanic manufacturing there are lots of micromechanical devices sequentially built up on the same carrier substrate. With the last manufacturing process step being completed these devices have to be removed from the carrier substrate or the wafer has to be diced to obtain individual chips. After removal of the devices or after dicing the wafer the devices or chips have to be stored and/or transported to the e.g. circuit boards or other elements which will be populated with individual devices or chips. During and after the removal step which usually is accomplished by a wet etching agent the individual devices are uncontrolledly swimming in the etching solvent and due to internal mechanical strain they are more or less bended or warped. This causes serious problems for the subsequent treatment of these devices. It was suggested to provide connecting strips between the individual devices and to cut up the strips after the removal process by e.g. laser dicing. This solution however requires additional process steps which may cause technical problems and increases the manufacturing costs.

Various carrier systems for storing and transporting small devices are known, e.g. from IBM Technical Disclosure Bulletin Vol. 28 No. 8, January 1986, pages 3375-3377. This article describes a chip carrier designed to facilitate electrically and mechanically safe storage, handling and transport of silicon chips within a chip manufacturing environment. Like many other known chip storage and transport systems the chip carrier is only capable of storing single or individual chips detached from the Bulk material.

IBM Technical Disclosure Bulletin Vol. 26 No. 5, October 1983, pages 2348/49 discloses a bulk removal fixture for diced semiconductor wafers which consists of two parts, a base and a cover. The base accepts the diced wafer still attached to a backing tape. The cover is then matched to the base, forming the bulk removal fixture. Integral to both the base and the cover is a fine mesh whose size is suitable to allow dicing chafe to pass through and out of the fixture but confining the devices to the fixture. The base and the cover are placed a minimum distance apart to prevent vertical movement of the devices. The base also contains a cutout to provide zero-drop height transfer of the devices from the bulk removal fixture to e.g. a vibratory bowl. The fixture provides for removal of the devices from the backing tape, removal of the dicing chafe, cleaning of the devices, protection against handling damage, safe transport to the removal area and an accurate device counting method. This fixture is however especially designed and suitable for the bulk removal process and the transport of diced semiconductor wafers.

It is an object of the present invention to provide a supporting plate and a bulk removal, transport and storage fixture suitable for various kinds of small batch-fabricated devices which allow controlled removal, safe transport and storage of the individual devices.

BRIEF SUMMARY OF THE INVENTION

The supporting plate has openings penetrating from the top side to the bottom side of the plate and raised retaining means on its bottom side. The raised retaining means are provided in sufficient number and are arranged according to the shape of the devices for retaining the devices. Flange means which are designed for providing vacuum or agents to the devices on the supporting plate are connected to the supporting plate thus forming a fixture.

By changing the arrangement of the raised retaining means and/or the openings penetrating from the top side to the bottom side of the plate the supporting plate and the fixture may easily be adapted to different sizes and kinds of devices. The supporting plate allows the mechanical fixing of the devices, especially during the removal step. The flange means are designed for providing vacuum or agents and by adding the suitable agent they thus allow the controlled removal of the individual devices which are kept in place during the removal from a carrier, a tape or from the bulk material. By adding vacuum the removed individual devices are kept at their places for transport or storing purposes. The support plate and the flange means may easily be cleaned and reused several times and thus offer a reliable and cost saving bulk removal, storage and transport fixture.

The method for producing the supporting plate comprises the steps providing a plate, preferably a silicon wafer, polished on both the plate surfaces, forming a pattern of raised retaining means on the bottom side of the plate by photolithographic and etching processes, covering the bottom side of the plate and the raised retaining means with a layer protecting against etching, forming openings penetrating from the top side to the bottom side of the plate by photolithographic and etching processes on the top side of the plate and removing the etch protecting layer.

This sequence of process steps allows the supporting plate and the fixture to be easily manufactured using techniques known from micromechanical and semiconductor manufacturing processes.

BRIEF DESCRIPTION OF THE DRAWINGS

Ways of carrying out the invention are described in detail below with reference to drawings showing only specific embodiments in which:

FIG. 3 shows the bottom side of the supporting plate with the raised retaining means;

FIG. 4 shows the bottom side of the supporting plate with the raised retaining means and the openings penetrating to the top side of the plate;

FIG. 5 shows the top side of the plate with the openings penetrating to the bottom side of the plate and the sidewalls of the openings;

DETAILED DESCRIPTION OF THE INVENTION

Figure 1:
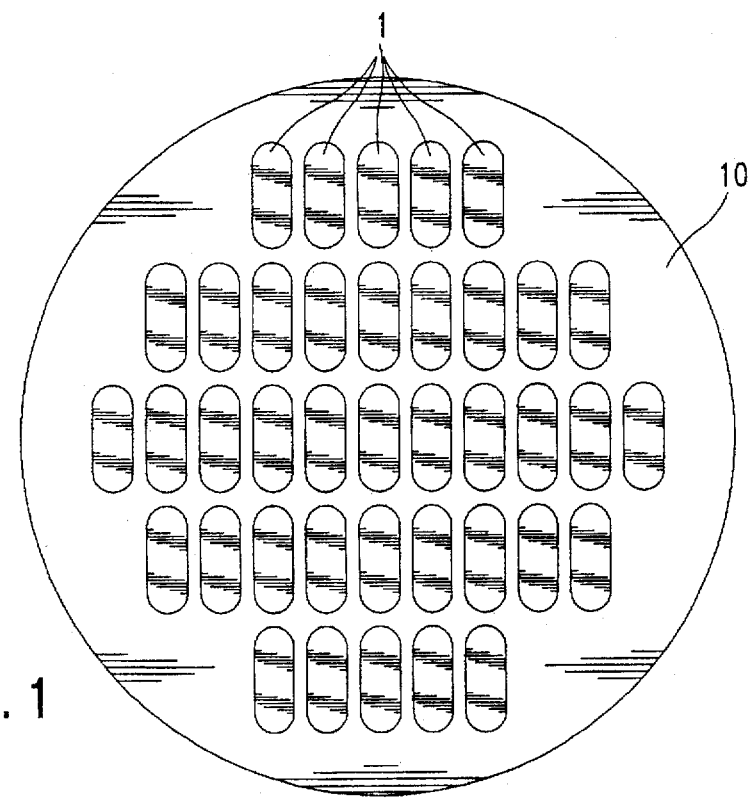
FIG. 1 shows an array of small devices on a carrier substrate.

FIG. 1 shows a carrier substrate 10 or a carrier plate with an array of small devices 1 thereon. These devices may be mechanical, optical, micromechanical, magnetic, electrical devices or others which have been simultaneously manufactured in a great amount in a batch-fabrication process on the carrier substrate. The dimensions of these devices typically are in the range of millimeters or micrometers. Miniaturized integrated magnetic read/write heads with slider and suspension for example are sequentially produced on a carrier wafer in arrays of more than 1000 parts. Typical dimensions of these parts are lengths of approximately 11 mm, widths of approximately 0.6 mm and a thickness of about 40 μm.

Figure 2:
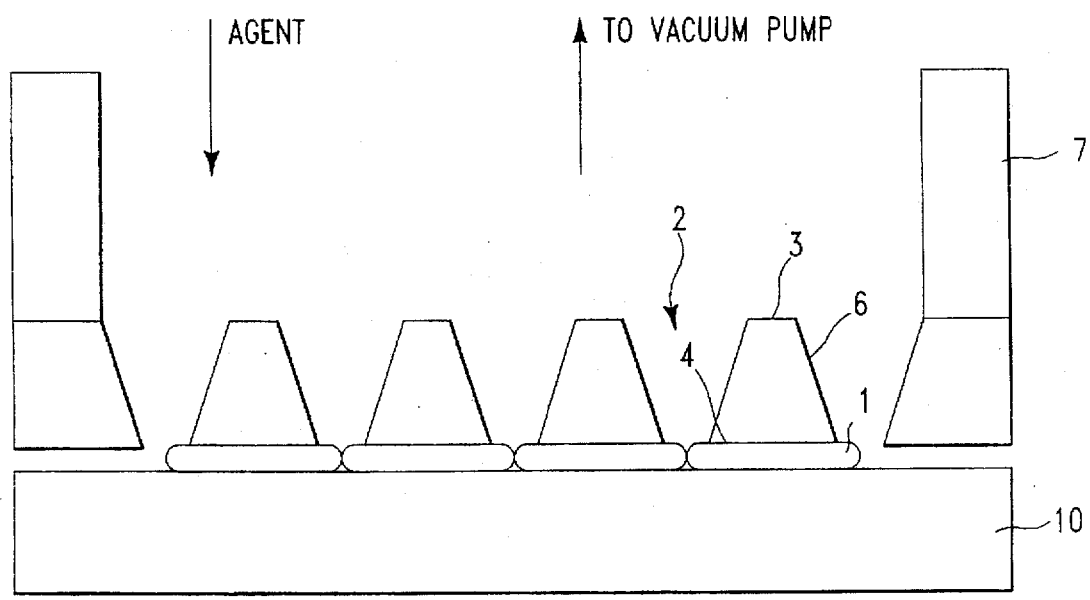
FIG. 2 is a cross-sectional view of a carrier substrate with small devices and of the bulk removal, transport and storage fixture with flange means.

The cross-sectional view of FIG. 2 shows a carrier substrate 10 with small devices 1 and the bulk removal, transport and storage fixture with flange means 7 descended with the bottom side 4 of the fixture onto the devices of the carrier substrate. A vacuum (i.e., suction) is applied through passages or cavities in the flange means 7. Before the removal of the devices 1 takes place the fixture is held in this release position by suction. After the removal step the individual devices become attached to the bottom side of the fixture by suction. Thus keeping their well-defined position the individual devices may easily be transported for subsequent treatment.

Figure 3:
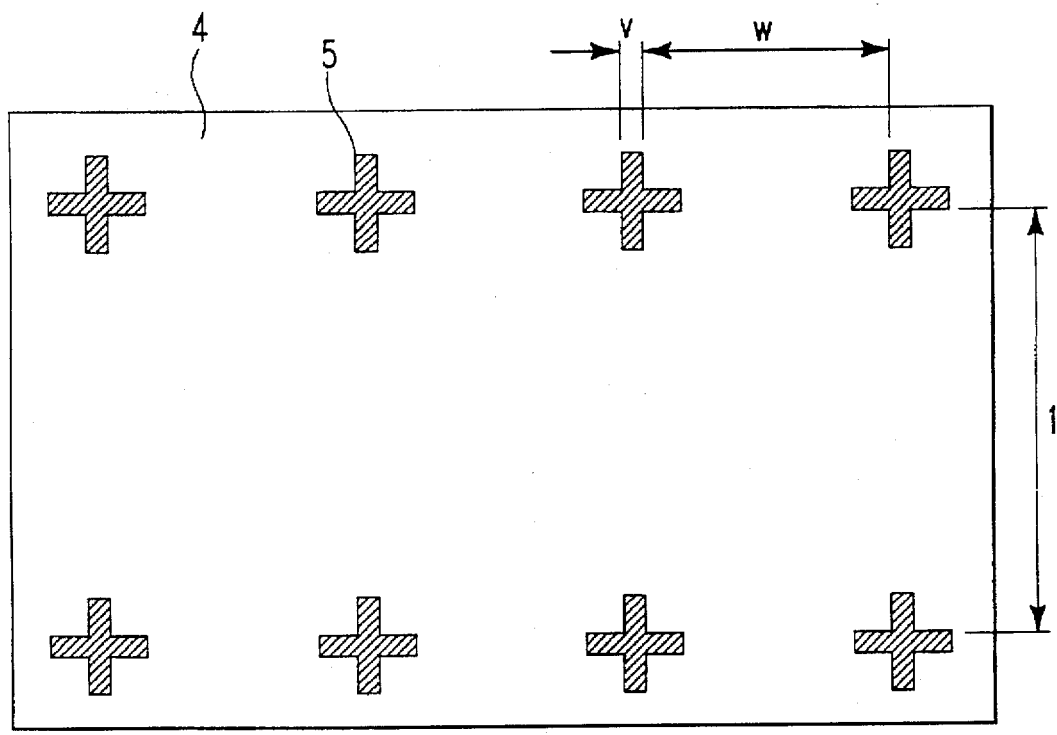
FIGS. 3 to 5 show the supporting plate during the several manufacturing steps.
Figure 4:
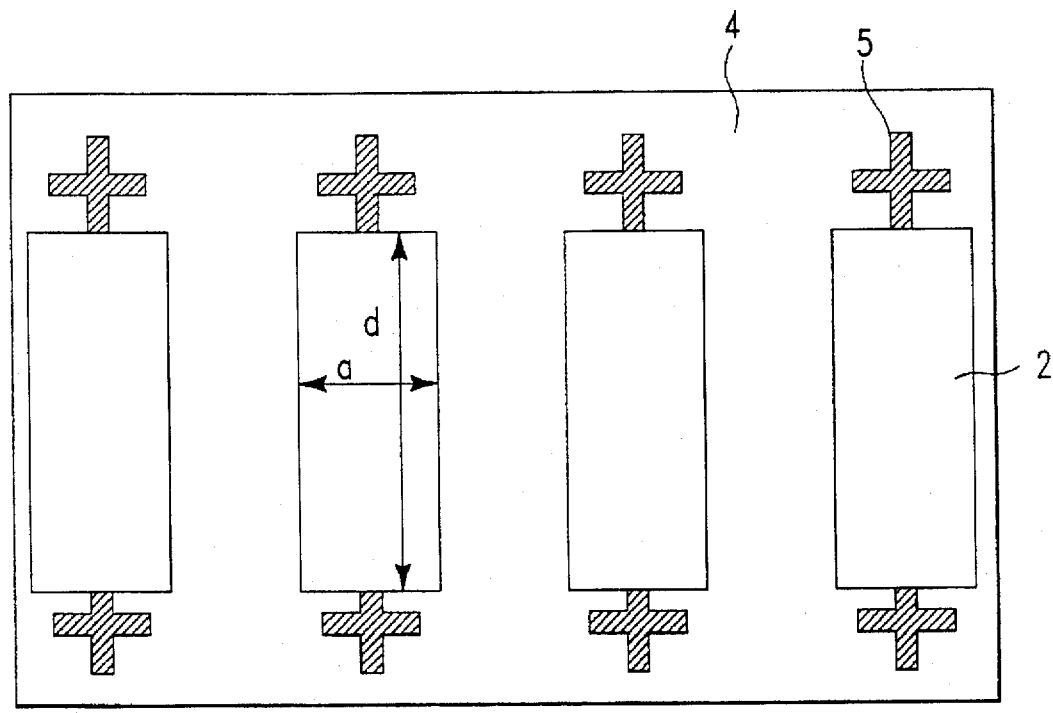
Figure 5:
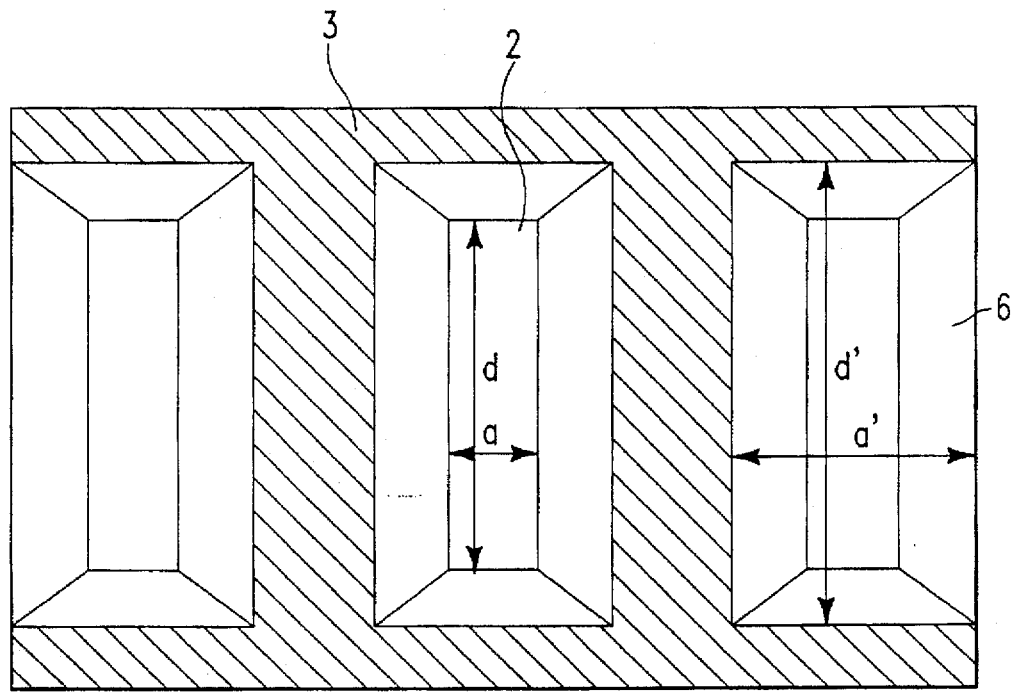

The method for producing the supporting plate and the fixture will now be described with reference to FIGS. 3 to 5 showing the supporting plate during the several manufacturing steps.

Various materials may be chosen as basic material for producing the supporting plate and the fixture. Due to its extraordinary properties the use of a silicon wafer as basic material is very advantageous and allows to use known micromechanical and semiconductor manufacturing processes. In the following the process sequence with a silicon wafer as basic material will be described. Other possible basic materials may probably afford other processes and/or another process sequence.

The silicon wafer used as basic material is polished on both the plate surfaces 3,4. With photolithographic and etching processes a pattern of raised retaining means 5 is formed on the bottom side 4 of the silicon wafer as shown in FIG. 3. For achieving a pattern of very small and accurately shaped retaining means 5 a dry etch process should be preferred.

Depending on the shape and thickness of the devices to be retained the retaining means 5 are more or less raised from the bottom side surface 4 of the wafer, they should be provided in sufficient number and they should be arranged according to the shape of the devices 1 to be retained. In the embodiment of FIG. 3 the raised retaining means 5 have the shape of a cross raised from the bottom side 4 surface of the silicon wafer by about 50 μm and the cross studs have a width v of some tens of micrometers. The arrangement of the retaining means in this embodiment is adapted for retaining devices which are substantially rectangular in shape. Therefore the raised retaining means 5 are arranged in a way that the distances of facing pairs of crosses and of neighboured crosses correspond to the length 1 and the width w of the devices 1 to be retained. The width v of the cross studs is to be chosen very carefully since the structure of the supporting plate and the fixture have to be adapted to the structure of the carrier substrate and vice versa. Increasing the width v may become the limiting factor for the amount of parts which may be batch-fabricated on the carrier substrate.

A protective layer acting as etchstop is then deposited onto the bottom side 4 of the silicon wafer and onto the raised retaining crosses 5. Suitable materials for the protective layer are $SiO_2$ or $Si_3N_4$.

Openings 2 penetrating from the top side 3 to the bottom side 4 of the silicon wafer are formed by photolithographic and etching processes. The etching process may be an anisotropic wet etch step or an anisotropic dry etch step starting from the top side 3 of the silicon wafer. If possible in view of the dimensions of the openings 2 the cheaper anisotropic wet etch step could be preferred.

FIG. 4 shows the bottom side 4 of silicon wafer and FIG. 5 shows the top side 3 of the silicon wafer with the openings 2 penetrating to the bottom side and the sidewalls 6 of the openings 2 after the completion of the etch through step. The etching step starts from the top side 3 of the silicon wafer.

In the embodiment of FIGS. 3 to 5 the size of the openings 2 on the top side 3 differs from the size of the corresponding openings 2 on the bottom side 4 of the wafer and the side-walls 6 of the openings 2 are wedge-shaped. In the embodiment described here the openings 2 are rectangular in shape and the width a' and the length d' of the openings on the top side 3 of the wafer are larger than the width a and the length d of the corresponding openings on the bottom side 4 of the wafer.

After the etch through step being completed a removal step removes the etchstop layer from the bottom side surface 4 and from the retaining crosses 5 and the masking layer used for lithography from the top side surface 3.

In dependence of the kind of devices the supporting plate and the fixture shall be used for and especially dependent on the agents required for the bulk removal of these devices the supporting plate should be covered with a passivation layer. Suitable materials for the passivation layer are $SiO_2$, $Si_3N_4$, SiC or diamond-like-carbon.

For providing the devices 1 formed on the supporting plate with vacuum or removal agents flange means 7 are connected (e.g., by suction) to the supporting plate thus forming a bulk removal, transport and storage fixture. The flange means 7 may be made of the supporting plate material or of other materials.

Figure 6:
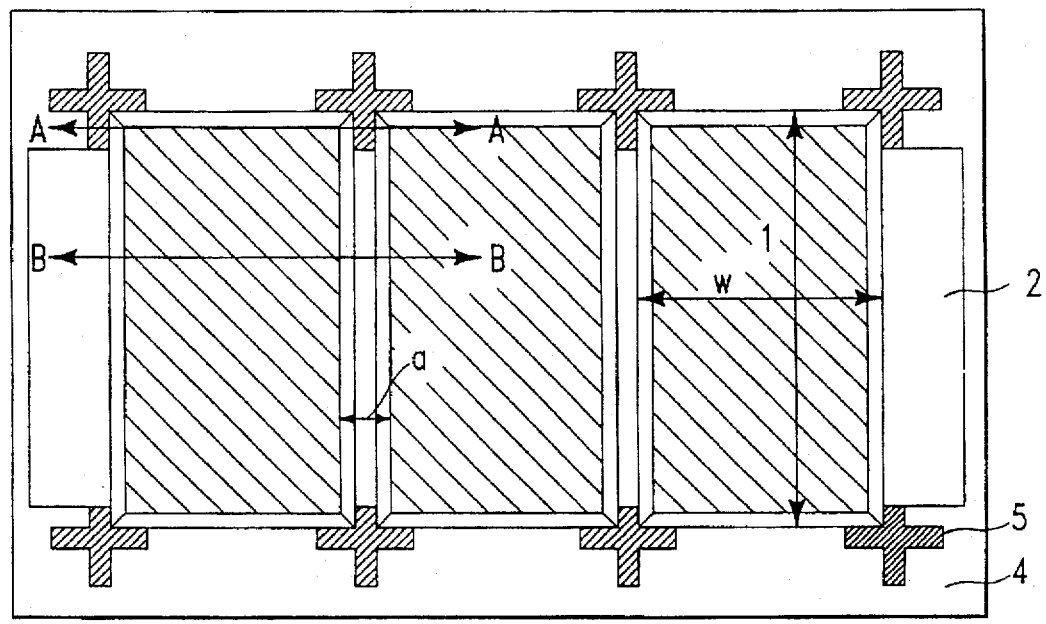
FIG. 6 shows the bottom side of the plate with small devices retained by the raised retaining means.
Figure 7:
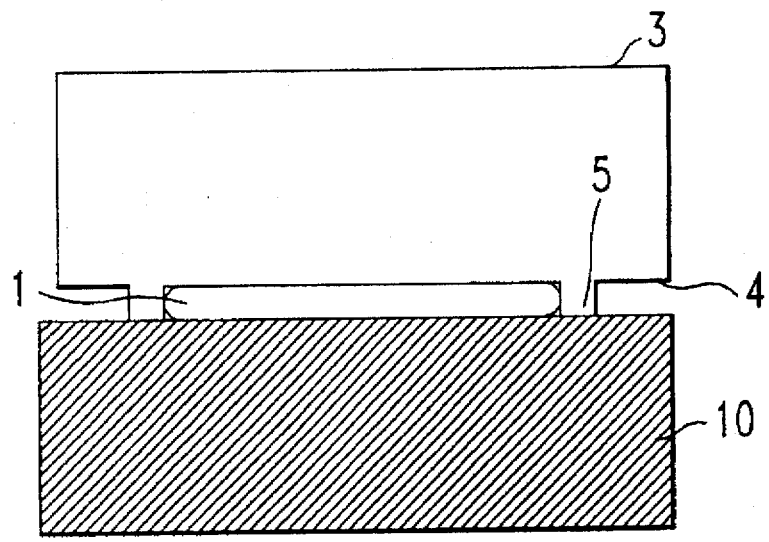
FIG. 7 is a cross-sectional view along the line A–A' of FIG. 6 showing the bulk removal, transport and storage fixture with a retained small device
Figure 8:
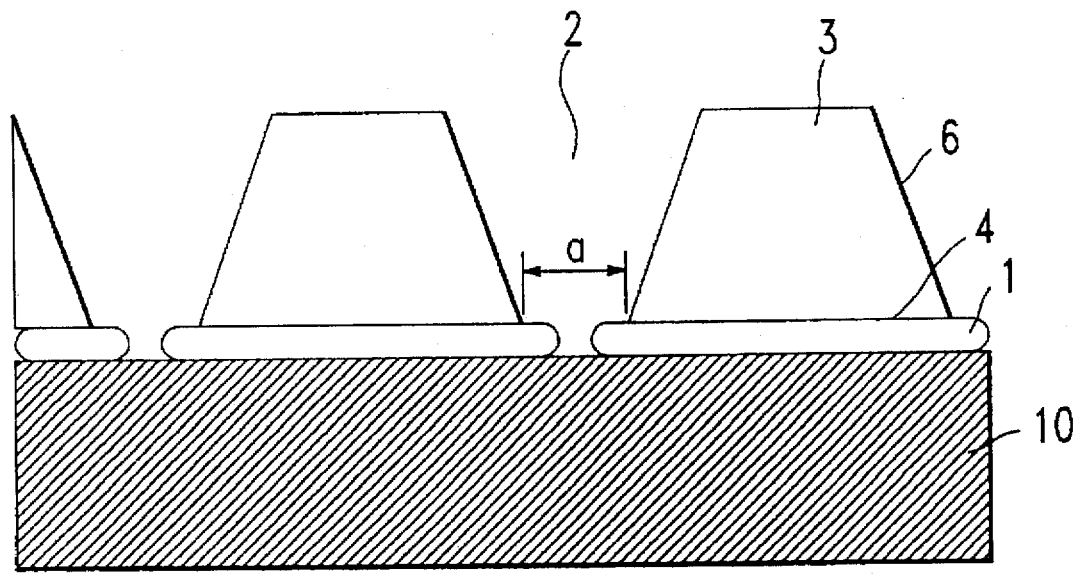
FIG. 8 is a cross-sectional view along the line B–B' of FIG. 6 showing the bulk removal, transport and storage fixture with retained small devices.

FIG. 6 shows the bottom side 4 of the wafer with devices retained by the raised crosses 5. FIG. 7 is a cross-sectional view along the line A–A' of FIG. 6 and FIG. 8 is a cross-sectional view along the line B–B' of FIG. 6 showing the bulk removal, transport and storage fixture with a retained device.

For controlled bulk removal of the small batch-fabricated devices 1 from the substrate carrier or wafer, the bottom side 4 of the bulk removal, transport and storage fixture is put down onto the substrate carrier 10. By the flange means 7 an agent capable of stripping off the devices 1 from the carrier 10 is provided. During and after the removal step the individual devices are kept at their defined places by the retaining crosses 5.

The stripping or removal agents are provided from the top side 3 of the wafer through the openings 2. As may be seen in FIG. 8 the distance a between the wedge-shaped sidewalls 6 of an opening at the bottom side of the wafer is sufficient for the undisturbed agent supply of the devices to be removed. After the removal of the devices vacuum is provided by the flange means 7 to keep the individual devices 1 at their defined places during transport or storage.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A method for producing a supporting plate for small batch-fabricated devices (1), said supporting plate having openings (2) penetrating from the top side (3) to the bottom side (4) of said plate and having raised retaining means (5) provided on the bottom side (4) of said supporting plate, the method comprising the steps of:

providing a plate, preferably a silicon wafer, wherein said plate is polished on both the plate surfaces (3,4);

forming a pattern of raised retaining means (5) on the bottom side (4) of said plate by photolithographic and etching processes;

covering the bottom side (4) of said plate and said raised retaining means (5) with a layer protecting against etching;

forming openings (2) penetrating from the top side (3) to the bottom side (4) of said plate by photolithographic and etching processes on the top side (3) of said plate; and removing said etch protecting layer.

2. The method of claim 1 further comprising the step of covering said supporting plate with a passivation layer after the step of removing.

3. The method of claim 2 wherein said passivation layer comprises a layer of $SiO_2$, $Si_3N_4$, SiC or diamond-like carbon.

4. The method of claim 1 wherein said layer protecting against etching comprises a layer of $SiO_2$ or $Si_3N_4$.

5. The method of claim 1 further comprising the step of connecting flange means (7) to said supporting slate.

6. A method for the controlled removal of small batch-fabricated devices from a carrier utilizing a bulk removal, transport and storage fixture, said fixture comprising a supporting plate and a flange means (7) connected to said supporting plate, said supporting plate having openings (2) penetrating from the top side (3) to the bottom side (4) of said plate and having raised retaining means (5) provided on the bottom side (4) of said plate, the method comprising the steps of:

putting down the bottom side (4) of said bulk removal, transport and storage fixture onto the carrier (10) with the small batch-fabricated devices (1) and positioning said bulk removal, transport and storage fixture with respect to the small batch-fabricated devices such that portions of adjoining devices share the same opening; and providing an agent by said flange means (7), wherein said agent is capable of stripping off said devices (1) from said carrier (10) to provide individual devices;

wherein said retaining means (5) are keeping said individual devices at their defined places.

7. The method of claim 6 further comprising the step of:

providing vacuum by said flange means (7) to keep said individual devices (1) at their defined places.

8. Supporting plate for small batch-fabricated devices (1) having openings (2) penetrating from the top side (3) to the bottom side (4) of said plate and having raised retaining means (5) provided on the bottom side (4) of said plate, wherein said raised retaining means (5) are provided in sufficient number and are arranged according to the shape of said devices (1) for retaining said devices (1), wherein the material for said supporting plate is silicon.

9. Supporting plate for small batch-fabricated devices (1) having side-walls defining openings (2), said openings defined by said side-walls penetrating from the top side (3) to the bottom side (4) of said plate, wherein the size of said openings (2) defined by said side-walls on the top side (3) of said plate differs from the size of the corresponding openings (2) defined by said side-walls on the bottom side (4) of said plate and wherein the side-walls (6) of said openings (2) are wedge-shaped, and having raised retaining means (5) provided on the bottom side (4) of said plate, wherein said raised retaining means (5) are provided in sufficient number and are arranged according to the shape of said devices (1) for retaining said devices (1).

10. Supporting plate for small batch-fabricated devices (1) having side-walls defining openings (2), said openings defined by said side-walls penetrating from the top side (3) to the bottom side (4) of said plate, wherein said openings (2) defined by said side-walls are rectangular in shape and wherein the width a' and the length d' of said openings (2) defined by said side-walls on the top side (3) of said plate are larger than the width a and the length d of said corresponding openings (2) defined by said side-walls on the bottom side (4) of said plate, and having raised retaining means (5) provided on the bottom side (4) of said plate, wherein said raised retaining means (5) are provided in sufficient number and are arranged according to the shape of said devices (1) for retaining said devices (1).

11. Supporting plate for small batch-fabricated devices (1) having openings (2) penetrating from the top side (3) to the bottom side (4) of said plate, wherein said openings (2) are rectangular in shape and wherein the width a' and the length d' of said openings (2) on the top side (3) of said plate are larger than the width a and the length d of said corresponding openings (2) on the bottom side (4) of said plate, and having raised retaining means (5) provided on the bottom side (4) of said plate, wherein said raised retaining means (5) have the shape of a cross raised from the bottom side (4) surface of said plate by about 50 um, wherein the cross studs have a width (v) of some tens of micrometers and wherein said raised retaining means (5) are provided in sufficient number and are arranged according to the shape of said devices (1) for retaining said devices (1).

12. The supporting plate of claim 11 wherein said raised retaining means (5) are arranged in a way that the distances of facing pairs of crosses and of neighboured crosses correspond to the length (1) and the width (w) of said devices (1) to be retained.

13. A bulk removal, transport and storage fixture for small batch-fabricated devices comprising a supporting plate for small batch-fabricated devices (1) having openings (2) penetrating from the top side (3) to the bottom side (4) of said plate and having raised retaining means (5) provided on the bottom side (4) of said plate, wherein said raised retaining means (5) are provided in sufficient number and are arranged according to the shape of said devices (1) for retaining said devices (1); and flange means (7) connected to said supporting plate, wherein said flange means (7) are designed for providing vacuum or agents to the devices (1) on said supporting plate, wherein the material for said supporting plate is silicon.

14. A bulk removal, transport and storage fixture for small batch-fabricated devices comprising:

a supporting plate for small batch-fabricated devices (1) having side-walls defining openings (2), said openings defined by said side-walls penetrating from the top side (3) to the bottom side (4) of said plate and having raised retaining means (5) provided on the bottom side (4) of said plate, wherein the size of said openings (2) defined by said side-walls on the top side (3) of said plate differs from the size of the corresponding openings (2) defined by said side-walls on the bottom side (4) of said plate and wherein the side-walls (6) of said openings (2) are wedge-shaped, and wherein said raised retaining means (5) are provided in sufficient number and are arranged according to the shape of said devices (1) for retaining said devices (1); and flange means (7) connected to said supporting plate, wherein said flange means (7) are designed for providing vacuum or agents to the devices (1) on said supporting plate.

15. A bulk removal, transport and storage fixture for small batch-fabricated devices comprising: a supporting plate for small batch-fabricated devices (1) having side-walls defining openings (2), said openings defined by said side-walls penetrating from the top side (3) to the bottom side (4) of said plate and having raised retaining means (5) provided on the bottom side (4) of said plate, wherein said openings (2) defined by said side-walls are rectangular in shape and wherein the width a' and the length d' of said openings (2) defined by said side-walls on the top side (3) of said plate are larger than the width a and the length d of said corresponding openings (2) defined by said side-walls on the bottom side (4) of said plate, and wherein said raised retaining means (5) are provided in sufficient number and are arranged according to the shape of said devices (1) for retaining said devices (1); and flange means (7) connected to said supporting plate, wherein said flange means (7) are designed for providing vacuum or agents to the devices (1) on said supporting plate.

16. A bulk removal, transport and storage fixture for small batch-fabricated devices comprising a supporting plate for small batch-fabricated devices (1) having openings (2) penetrating from the top side (3) to the bottom side (4) of said plate and having raised retaining means (5) provided on the bottom side (4) of said plate, wherein said openings (2) are rectangular in shape and wherein the width a' and the length d' of said openings (2) on the top side (3) of said plate are larger than the width a and the length d of said corresponding openings (2) on the bottom side (4) of said plate, wherein said raised retaining means (5) have the shape of a cross raised from the bottom side (4) surface of said plate by about 50 um, wherein the cross studs have a width (v) of some tens of micrometers and wherein said raised retaining means (5) are provided in sufficient number and are arranged according to the shape of said devices (1) for retaining said devices (1); and flange means (7) connected to said supporting plate, wherein said flange means (7) are designed for providing vacuum or agents to the devices (1) on said supporting plate.

17. The fixture of claim 16 wherein said raised retaining means (5) are arranged in a way that the distances of facing pairs of crosses and of neighboured crosses correspond to the length (1) and the width (w) of said devices (1) to be retained.

* * * * *